United States Patent [19]
Wu

[11] Patent Number: 6,043,124
[45] Date of Patent: Mar. 28, 2000

[54] METHOD FOR FORMING HIGH DENSITY NONVOLATILE MEMORIES WITH HIGH CAPACITIVE-COUPLING RATIO

[75] Inventor: Shye-Lin Wu, Hsinchu, Taiwan

[73] Assignee: Texas Instruments-Acer Incorporated, Hsinchu, Taiwan

[21] Appl. No.: 09/042,347

[22] Filed: Mar. 13, 1998

[51] Int. Cl.[7] ................................................. H01L 21/336
[52] U.S. Cl. ...................... 438/260; 438/211; 438/257; 438/260; 438/263; 438/264; 438/299; 438/301; 257/309; 257/317; 257/321
[58] Field of Search .................................. 438/211, 257, 438/260, 262, 263, 264, 299, 301; 257/309, 317, 321

[56] References Cited

U.S. PATENT DOCUMENTS

| | | | |
|---|---|---|---|
| 4,404,577 | 9/1983 | Cranford, Jr. et al. ................. | 257/318 |
| 5,429,966 | 7/1995 | Wu et al. ................................. | 438/594 |
| 5,683,923 | 11/1997 | Shimizu et al. ......................... | 438/257 |
| 5,796,140 | 8/1998 | Tomioka ................................. | 257/316 |
| 5,960,285 | 9/1999 | Hong ...................................... | 438/264 |

OTHER PUBLICATIONS

Albert Bergemont et al., Low Voltage NVG™: A New High Performance 3 V/5 V Flash Technology for Portable Computing and Telecommunications Applications, IEEE Transactions on Electron Devices, vol. 43, No. 9, Sep. 1996, pp. 1510–1517.

H. Shirai et al., A 0.54 $\mu m^2$ Self–Aligned, HSG Floating Gate Cell (SAHF Cell) for 256Mbit Flash Memories, 1995 IEEE, pp. 653–656.

Yosiaki S. Hisamune et al., A High Capacitive–Coupling Ratio (HiCR) Cell for 3 V–Only 64 Mbit and Future Flash Memories, 1993 IEEE, pp. 16–22.

Shye Lin Wu et al., Characterization of Thin Textured Tunnel Oxide Prepared by Thermal Oxidation of Thin Polysilicon Film on Silicon, IEEE Transactions on Electron Devices, vol. 43, No. 2, Feb. 1996, pp. 287–294.

Christopher J. Hegarty et al., Enhanced Conductivity and Breakdown of Oxides Grown on Heavily Implanted Substrates, Solid–State Electronics, vol. 34, No. 11, 1991, pp. 1207–1213.

*Primary Examiner*—Mahshid Saadat
*Assistant Examiner*—N. Dean Richards
*Attorney, Agent, or Firm*—Harness, Dickey & Pierce, P.L.C.

[57] ABSTRACT

The present invention proposes a method for fabricating a high speed and high density nonvolatile memory cell. First, a semiconductor substrate with defined field oxide and active region is prepared. A stacked silicon oxide/silicon nitride layer is deposited on the substrate and then the tunnel oxide region is defined by a standard photolithography process followed by an anisotropic etching. A high temperature steam oxidation process is used to grow a thick thermal oxide on the non-tunnel region. After removing the masking silicon nitride layer, the n+ impurity ions is implanted to form the source and drain, and a thermal annealing is performed to recover the implantation damage and to drive in the doped ions. Next, the pad oxide film is etched back and an ultra-thin undoped α-Si, or HSG-Si, film is deposited. A thermal oxidation process is carried out to convert the undoped α-Si or HSG-Si into textured tunnel oxide. Finally, the first n+ doped polysilicon film which serves as the floating gate, the interpoly dielectric such as ONO, the second n+ doped polysilicon film which serves as the control gate are sequentially formed, and the memory cell is finished.

35 Claims, 3 Drawing Sheets

METHOD FOR FORMING HIGH DENSITY NONVOLATILE MEMORIES WITH HIGH CAPACITIVE-COUPLING RATIO

BACKGROUND OF THE INVENTION

1. Field of the Invention

The present invention relates to a method for fabricating a nonvolatile memory cell, and more especially, to a method for fabricating textured tunnel oxide with high electron injection efficiency and a large charge-to-breakdown for low power nonvolatile memory.

2. Description of the Prior Art

Nonvolatile memories, including mask read-only memories (Mask ROM), programmable ROM (PROM), erasable programmable ROM (EPROM), electrically erasable programmable ROM (EEPROM or E$^2$PROM) and flash memories, retain their memory data whenever the power is turned off, and have wide applications in the computer and electronic industry. In recent years, the portable computers and telecommunications market develop rapidly and become a major driving force in semiconductor integrated circuit's design and technology. As stated by A. Bergemont, et al., in "Low Voltage NVG™: A New High Performance 3 V/5 V Flash Technology for Portable Computing and Telecommunications Application", IEEE Trans. Electron Devices Vol. 43, p. 1510, (1996), it creates a great need for low power, high density, and electrically re-writable nonvolatile memories. That is, the memories programmable and erasable as EPROM, E$^2$PROM or flash memories are required for aforementioned systems to store operating systems or applications software.

The basic storage cell of these programmable and erasable memories contain a double polysilicon storage transistor with a floating gate isolated in silicon dioxide and capacitively coupled to a second control gate which is stacked above it. The E$^2$PROM cell further comprises an access, or select, transistor. These memories execute the program and erasure by charging or discharging their floating gates. For example, the EPROM is programmed by hot electron injection at the drain to selectively charge the floating gate and erased by discharging the floating gate with ultraviolet light or X-ray, which the latter has never been commercially applied for this purpose. The E$^2$PROM and most of the flash memories are programmed by hot electron injection or cold electron tunneling named Flower-Nordheim tunneling, and erased mostly by Flower-Nordheim tunneling from the floating gate to the source, with the control gate ground.

Flower-Nordheim tunneling, or cold electron tunneling, is a quantum-mechanical effect, which allows the electrons to pass through the energy barrier at the silicon-silicon dioxide interface at a lower energy than required to pass over it. H. Shirai, et al., stated in their paper "A 0.54 $\mu m^2$ Self-Aligned, HSG Floating Gate Cell (SAHF Cell) for 256 Mbit Flash Memories", IEDM Tech. Dig. Vol. 95, p. 653, (1995) that, because of its low current consumption, the Flower-Nordheim program/erase scheme becomes indispensable for low power operation of the E$^2$PROM and flash memories. But the Flower-Nordheim program/erase scheme requires high voltage that applied to control gate of the memory cell due to its need for a large reversible electric field to the thin oxide separating the floating gate from the substrate. Therefore, to lower the control gate bias, the memory cell must have a high capacitive-coupling ratio structure.

Y. S. Hisamune, et al., propose a method for fabricating a flash memory cell with contactless array and high capacitive-coupling ratio in "A High Capacitive-Coupling Ratio (HiCR) Cell for 3 V-Only 64 Mbit and Future Flash Memories", IEDM Tech. Dig. Vol. 93, p. 19, (1993). But this method achieves high capacitive-coupling ratio with four times of polysilicon deposition and has a complex fabrication. In addition, this cell structure makes it difficult to scale the size down and increase the integration of the memory due to its short tunnel oxides. Furthermore, as mentioned by C. J. Hegarty, et al., in "Enhanced Conductivity and Breakdown of Oxides Grown on Heavily Implanted Substrates", Solid-State Electronics, Vol. 34, p. 1207, (1991). It is also difficult to fabricate a thin tunnel oxide on the heavily doped substrate with a high electron injection efficiency and a large charge-to-breakdown for low power nonvolatile memories. Thus, to reach high capacitive-coupling ratio, high electron injection efficiency and a large charge-to-breakdown with a simple manufacture is the subject of high density and low power nonvolatile memories today.

SUMMARY OF THE INVENTION

A method for fabricating a nonvolatile memory cell with textured tunnel oxide is disclosed. First, the field oxide is formed, the active region is defined, and a semiconductor substrate is prepared. A stacked silicon oxide/silicon nitride layer is deposited on the substrate and then the tunnel oxide region is defined by a standard photolithography process followed by an anisotropic etching. A high temperature steam oxidation process is used to grow a thick thermal oxide on the non-tunnel region. After removing the masking silicon nitride layer, the n+ impurity ions is implanted to form the source and drain, and a thermal annealing is performed to recover the implantation damage and to drive in the doped ions. Next, the pad oxide film is etched back and an ultra-thin undoped α-Si, or HSG-Si, film is deposited. A thermal oxidation process is carried out to convert the undoped α-Si or HSG-Si into textured tunnel oxide. Finally, the first n+doped polysilicon film which serves as the floating gate, the interpoly dielectric such as ONO, the second n+ doped polysilicon film which serves as the control gate are sequentially formed, and the memory cell is finished.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention proposes a simple method to fabricate a nonvolatile memory cell with high capacitive-coupling ratio. The method described here includes many process steps well known in the art like photolithography, etching or chemical vapor deposition (CVD) which are not discussed in detail. In addition, the present invention utilize a method for forming textured tunnel oxide to attain high electron injection efficiency and a large-to-breakdown for low power nonvolatile memories.

Figure 1:
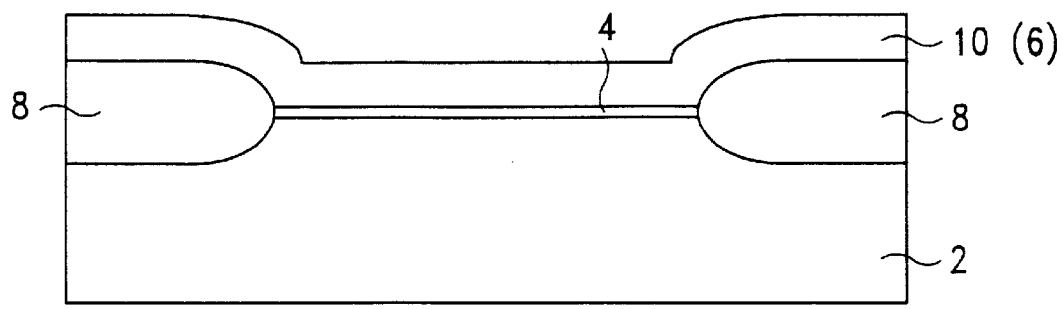
FIG. 1 is a cross-sectional view of a semiconductor wafer illustrating the step of forming a silicon oxide layer and a silicon nitride layer on the substrate according to the present invention.

Referring to FIG. 1, a single crystal silicon substrate 2 with a <100> crystallographic orientation is provided. A silicon oxide layer 4 is formed on the surface of the substrate 2. In addition to a pad oxide for the oxidation mask, the silicon oxide layer 4 can be used to act as a sacrificial oxide to prevent the channel effect during the later ion implantation. This pad oxide layer 4 has a thickness of about 40–300 angstroms, and can be grown by using thermal oxidation at a temperature of about 800–1100° C. , or using low pressure chemical vapor deposition (LPCVD) at a temperature of about 400–750° C. Next, a thick silicon nitride layer 6 is deposited, for example, using a LPCVD process at a temperature of about 700–800° C., on the pad oxide layer 4 to serve as an oxidation mask.

The field oxide (FOX) pattern is now defined by using a conventional manner of photolithography including photoresist coating, exposure, and development processes, and then a dry etching is carried out to etch the thick silicon nitride layer 6 and the pad oxide layer 4. After photoresist is removed and wet cleaned, a thermal oxidation in an oxygen steam environment is performed, and the thick field oxide regions 8 are grown with a thickness of about 3000–8000 angstroms, to provide isolation between active regions on the substrate 2. Then, the silicon nitride layer 6 is optionally removed, and a new silicon nitride layer 10 is created over the substrate 2.

Figure 2:
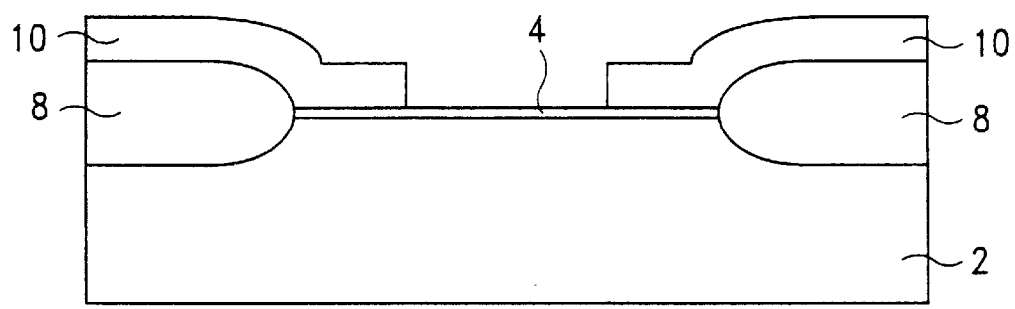
FIG. 2 is a cross-sectional view of a semiconductor wafer illustrating the step of defining the tunnel oxide regions on the substrate according to the present invention.
Figure 3:
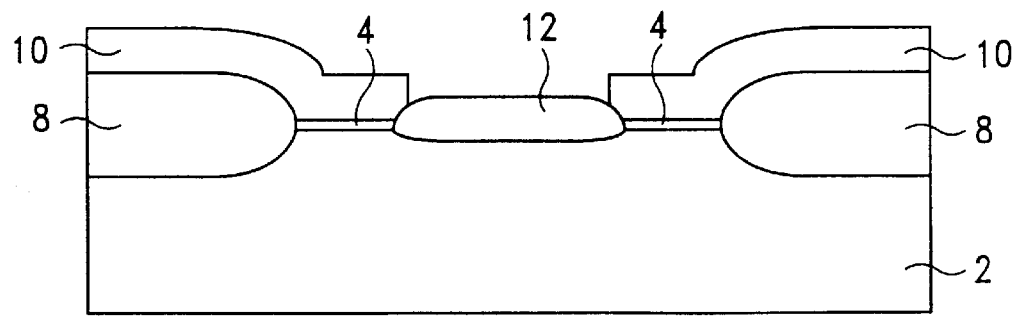
FIG. 3 is a cross-sectional view of a semiconductor wafer illustrating the step of growing a thick thermal oxide on the substrate according to the present invention.

Turning next to FIG. 2, another photolithography process is used to define the tunnel oxide region. An etching step follows to selectively etch the silicon nitride layer 10 but not the pad oxide layer 4 and expose a portion of the pad oxide layer 4 which defines the non-tunnel region on the active region. This selectivity can be reached by a dry etching process using $NF_3$ as the plasma source or by a wet etching process using hot phosphoric acid as the etching solution. It is noted that the wet etching will cause the undercut. A high temperature steam oxidation is then performed at a temperature of about 800–1100° C. to grow a thick thermal oxide 12 on the non-tunnel region, as shown in FIG. 3. This thermal oxide 12 has a thickness of about 300–2500 angstroms, and can raise the capacitive-coupling ratio of the memory cell.

Figure 4:
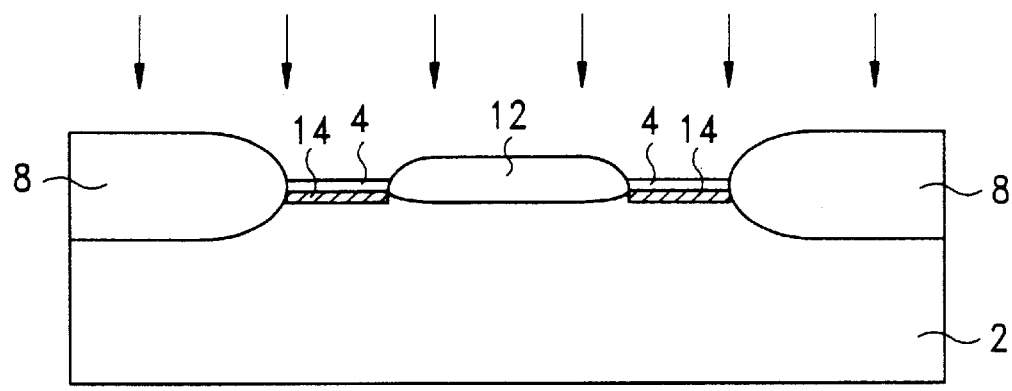
FIG. 4 is a cross-sectional view of a semiconductor wafer illustrating the step of forming the source and drain regions on the substrate according to the present invention.
Figure 5:
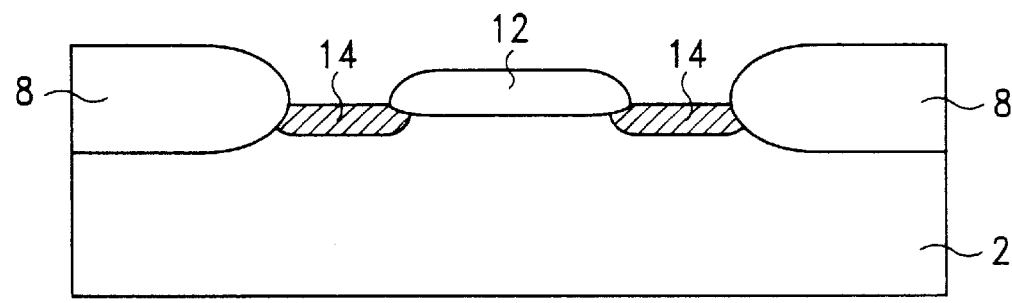
FIG. 5 is a cross-sectional view of a semiconductor wafer illustrating the step of performing a high temperature annealing and removing the pad oxide film according to the present invention.

Turning next to FIG. 4, the masking silicon nitride film 10 is removed by a wet etching with hot phosphoric acid. An n+ ion implantation is performed to implant appropriate impurity ions through the silicon oxide layer 4, but not the thick oxide 12, into the substrate 2 to form the source and drain 14. The implanted ions can be phosphorus ions, arsenic ions or antimony ions. The implantation energy and dosage are respectively about 0.5–150 keV and about $5\times10^{14}$–$5\times10^{16}$ atoms/$cm^2$. During the ion implantation, the silicon oxide layer 4 act as a buffer to prevent the substrate 2 from damage and to prevent the doping ions from channel effect. The substrate 2 is then thermal annealed to recover the implantation damage by a preferable method as rapid thermal processing (RTP) at a temperature of about 800–1150° C. The dopants are activated and driven in to form the best distribution profile at this step, as shown in FIG. 5. The silicon oxide 4 is now removed, with a suitable etchant such as buffered oxide-etching (BOE) solution or diluted solution of hydrofluoric acid (HF).

Figure 6:
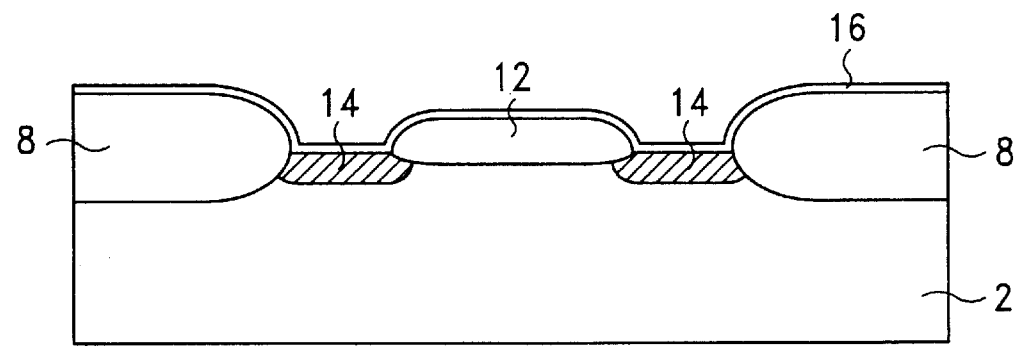
FIG. 6 is a cross-sectional view of a semiconductor wafer illustrating the step of depositing an ultra-thin undoped (α-Si or HSG-Si film on the substrate according to the present invention.
Figure 7:
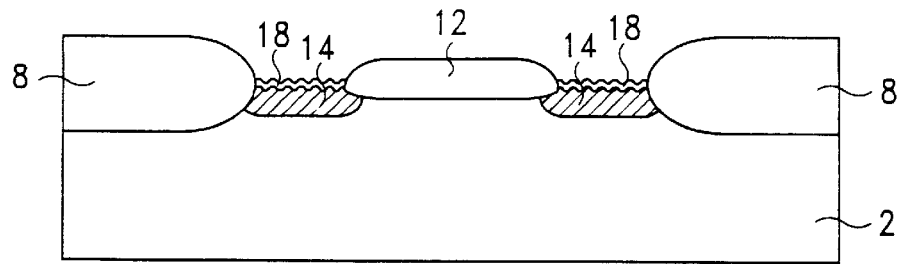
FIG. 7 is a cross-sectional view of a semiconductor wafer illustrating the step of performing a thermal oxidation to convert the ultra-thin α-Si into textured tunnel oxide according to the present invention.

Referring to FIG. 6, an ultra-thin undoped amorphous silicon (α-Si) film 16 is deposited over the substrate 2. This α-Si film 16 is formed by LPCVD at a temperature of about or 400–600° C. and has a thickness of about 20–300 angstroms. A thermal process with the temperature which could be raised gradually from 25° C. to 950° C. in an $N_2$ ambience follows, and the α-Si film 16 is crystallized into polysilicon. This polysilicon film will get the grains much smaller in the size and greater in the grain density as compared to the one deposited directly. Optionally, hemispherical grained silicon (HSG-Si) can be used instead of α-Si to form the silicon film 16 with a thickness of about 40–500 angstroms. Then, as shown in FIG. 7, a thermal oxidation process is performed in a dry-oxygen ambience at a temperature of about 750–1050° C. At this step, there is an enhanced oxidation rate at the grain boundaries because of the rapid diffusion of oxygen through the grain boundaries of the thin polysilicon film into the Si substrate. Therefore, as mentioned by S. L. Wu, et al., in "Characterization of Thin Textured Tunnel Oxide Prepared by Thermal Oxidation of Thin Polysilicon Film on Silicon", IEEE Trans. Electron Devices, Vol. 43, p. 287, (1996), a textured $Si/SiO_2$ interface is obtained. This textured interface will result in localized high electric field and subsequently enhance the electron injection from the substrate 2 into oxide. Thus, the textured tunnel oxide 18 exhibits a higher electron-injection efficiency, a significantly lower charge trapping rate, and a large charge-to-breakdown in comparison with the conventional tunnel oxide.

Figure 8:
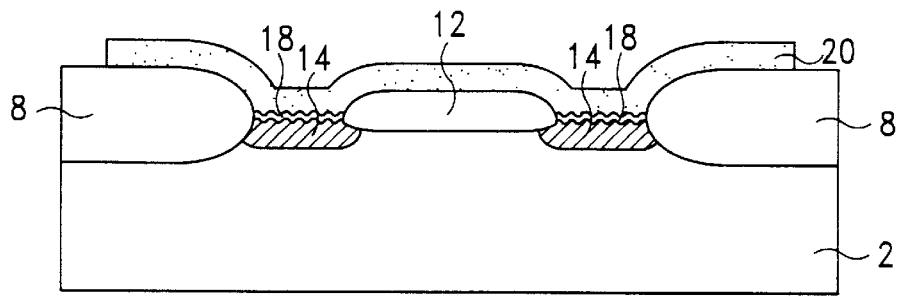
FIG. 8 is a cross-sectional view of a semiconductor wafer illustrating the step of depositing an n+ poly-Si film and then defining the floating gate according to the present invention.

Next, referring to FIG. 8, the conductive layer 20 is deposited on the substrate 2 preferably with a material of doped or in-situ doped n+ polysilicon by using a conventional LPCVD. A standard photolithography process is used to define the floating gate pattern. An anisotropic etching with $Cl_2$, $HCl_2$ or $SiCl_4$ as the plasma source is then carried out to etch the conductive layer, thereby the floating gate 20 is formed on the active region and a portion of the field oxide region.

Figure 9:
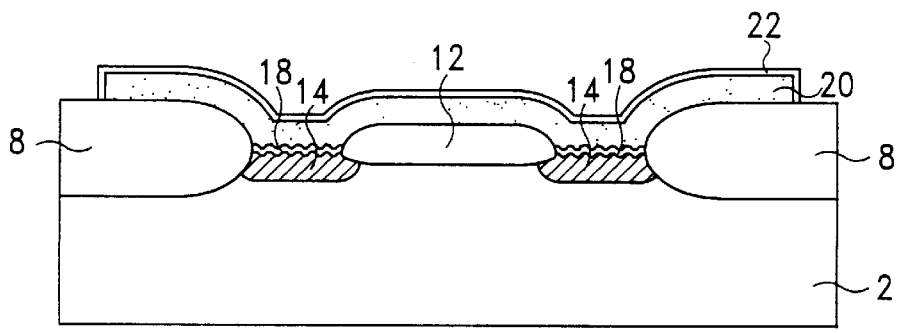
FIG. 9 is a cross-sectional view of a semiconductor wafer illustrating the step of forming an ultra-thin interpoly dielectric on the floating gate according to the present invention.
Figure 10:
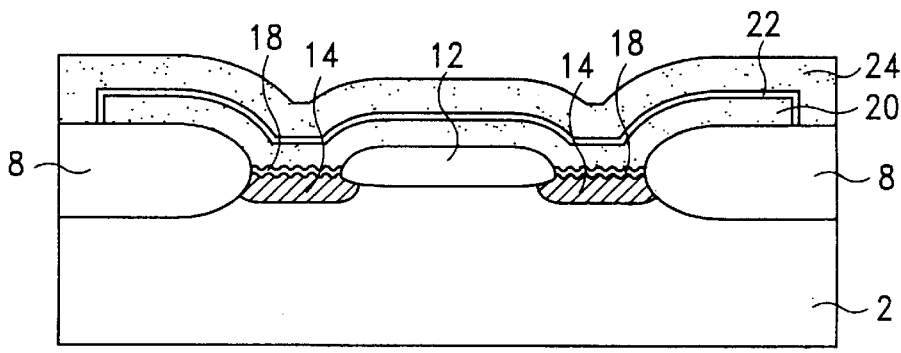
FIG. 10 is a cross-sectional view of a semiconductor wafer illustrating the step of depositing another n+ poly-Si film and then defining the control gate according to the present invention.

The ultra-thin interpoly dielectric (IPD) layer 22 deposited on the surface of the floating gate 20 is shown in FIG. 9. This interpoly dielectric layer 22 can be a material of a double film of silicon nitride and silicon oxide, a triple film of silicon oxide, silicon nitride and silicon oxide (ONO), or any other high dielectric constant film such as tantalum pentoxide ($Ta_2O_5$) or BST. Finally, referring to FIG. 10, another conductive layer formed of doped or in-situ doped n+ polysilicon is deposited and patterning on the interpoly dielectric layer 22 to serve as the control gate 24. Thus, the nonvolatile memory cell with textured tunnel oxide is finished according to the present invention.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for forming a nonvolatile memory cell with a textured tunnel oxide layer, said method comprising:

forming a silicon oxide layer on a semiconductor substrate;

forming a silicon nitride layer on said silicon oxide layer;

patterning said silicon nitride layer to define tunnel oxide region and expose a portion of said silicon oxide which defines the non-tunnel region of said semiconductor substrate;

performing a first thermal oxidation to oxidize a portion of said semiconductor substrate exposed by said silicon nitride, thereby generating a non-tunnel oxide on said semiconductor substrate;

removing said silicon nitride layer;

implanting ions into said semiconductor substrate to form a source and a drain using said non-tunnel oxide as a mask;

performing an annealing to said semiconductor substrate and simultaneously driving said ions into said semiconductor substrate;

removing said silicon oxide layer;

forming a first polysilicon layer on said semiconductor substrate;

performing a second thermal oxidation process to convert said first polysilicon layer into said textured tunnel oxide;

forming a second polysilicon layer over said tunnel and non-tunnel oxides to serve as a floating gate;

forming a dielectric layer on said floating gate; and forming a third polysilicon layer on said dielectric layer to serve as a control gate.

2. The method according to claim 1, wherein said semiconductor substrate is a p-type substrate.

3. The method according to claim 1, wherein said silicon oxide has a thickness of about 40–300 angstroms.

4. The method according to claim 1, wherein said first thermal oxidation is performed in an oxygen steam ambience at a temperature of about 800–1100° C.

5. The method according to claim 1, wherein said non-tunnel oxide has a thickness of about 300–2500 angstroms.

6. The method according to claim 1, wherein said implanted impurity ions are n-type ions.

7. The method according to claim 6, wherein said n-type ions are phosphorus ions.

8. The method according to claim 6, wherein said n-type ions are arsenic ions.

9. The method according to claim 6, wherein said n-type ions are antimony ions.

10. The method according to claim 6, wherein said n-type ions ions are implanted at about 0.5–150 keV with dosage of about $5 \times 10^{14}$–$5 \times 10^{16}$ atoms/cm$^2$.

11. The method according to claim 1, wherein said annealing is performed at a temperature of about 800–1150° C.

12. The method according to claim 1, wherein said first polysilicon layer is formed by following method:

depositing a amorphous silicon layer on said semiconductor substrate;

performing a heating process to crystallize said amorphous silicon layer into polysilicon layer.

13. The method according to claim 12, wherein said amorphous silicon layer has a thickness of about 20–300 angstroms.

14. The method according to claim 12, wherein said heating process is performed in a $N_2$ ambience at the temperature raised from 25° C. to 950° C.

15. The method according to claim 12, wherein said polysilicon layer has a thickness of about 20–300 angstroms.

16. The method according to claim 1, wherein said second thermal oxidation is performed in a dry oxygen ambient at a temperature of about 750–1050° C.

17. The method according to claim 1, wherein said second polysilicon layer is formed of n-type doped polysilicon.

18. The method according to claim 1, wherein said dielectric layer is formed of the material selected from the group consisting of tantalum pentoxide ($Ta_2O_5$), BST, a double film of silicon nitride and silicon oxide, and a triple film of silicon oxide, silicon nitride and silicon oxide (ONO).

19. The method according to claim 1, wherein said third polysilicon layer is formed of n-type doped polysilicon.

20. A method for forming a nonvolatile memory cell with a textured tunnel oxide layer, said method comprising:

forming a silicon oxide layer on a semiconductor substrate;

forming a silicon nitride layer on said silicon oxide layer;

patterning said silicon nitride layer to define tunnel oxide region and expose a portion of said silicon oxide which defines the non-tunnel region of said semiconductor substrate;

performing a first thermal oxidation to oxidize a portion of said semiconductor substrate exposed by said silicon nitride, thereby generating a non-tunnel oxide on said semiconductor substrate;

removing said silicon nitride layer;

implanting ions into said semiconductor substrate to form a source and a drain using said non-tunnel oxide as a mask;

performing an annealing to said semiconductor substrate and simultaneously driving said ions into said semiconductor substrate;

removing said silicon oxide layer;

forming a hemispherical grained silicon (HSG-silicon) layer on said semiconductor substrate;

performing a second thermal oxidation process to convert said HSG-silicon layer into said textured tunnel oxide;

forming a first polysilicon layer over said tunnel and non-tunnel oxides to serve as the floating gate forming a dielectric layer on said floating gate; and forming a second polysilicon layer on said dielectric layer to serve as the control gate.

21. The method according to claim 20 wherein said semiconductor substrate is a p-type substrate.

22. The method according to claim 20, wherein said silicon oxide has a thickness of about 40–300 angstroms.

23. The method according to claim 20, wherein said first thermal oxidation is performed in an oxygen steam ambience at a temperature of about 800–1100° C.

24. The method according to claim 20, wherein said non-tunnel oxide has a thickness of about 300–2500 angstroms.

25. The method according to claim 20, wherein said implanted impurity ions are n-type ions.

26. The method according to claim 25, wherein said n-type ions are phosphoric ions.

27. The method according to claim 25, wherein said n-type ions are arsenic ions.

28. The method according to claim 25, wherein said n-type ions are antimony ions.

29. The method according to claim 25, wherein said n-type ions ions are implanted at about 0.5–150 keV with dosage of about $5 \times 10^{14}$–$5 \times 10^{16}$ atom/cm$^2$.

30. The method according to claim 20, wherein said annealing is performed at a temperature of about 800–1150° C.

31. The method according to claim 20, wherein said HSG-silicon layer has a thickness of about 40–500 angstroms.

32. The method according to claim 20, wherein said second thermal oxidation is performed in a dry oxygen ambience at a temperature of about 750–1050° C.

33. The method according to claim 20, wherein said first polysilicon layer is formed of n-type doped polysilicon.

34. The method according to claim 20, wherein said dielectric layer is formed of the material selected from the group consisting of tantalum pentoxide (Ta$_2$O$_5$), BST, a double film of silicon nitride and silicon oxide, and a triple film of silicon oxide, silicon nitride and silicon oxide (ONO).

35. The method according to claim 20, wherein said second polysilicon layer is formed of n-type doped polysilicon.

* * * * *